United States Patent
Pan

(10) Patent No.: US 7,274,253 B2
(45) Date of Patent: Sep. 25, 2007

(54) TRANSMITTER APPARATUS WITH EXTENDED GAIN CONTROL

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 86 days.

(21) Appl. No.: 11/090,067

(22) Filed: Mar. 28, 2005

(65) Prior Publication Data

US 2006/0214728 A1    Sep. 28, 2006

(51) Int. Cl.
*H03F 1/14*    (2006.01)
(52) U.S. Cl. .................. 330/51; 330/124 R; 330/254
(58) Field of Classification Search .............. 330/51, 330/124 R, 254
See application file for complete search history.

(56) References Cited

U.S. PATENT DOCUMENTS 4,598,252 A * 7/1986 Andricos .................. 330/51
6,320,913 B1 * 11/2001 Nakayama ................ 375/297
6,326,842 B1 * 12/2001 Kuroda .................... 330/133
6,670,848 B2 * 12/2003 Fanous et al. ........... 330/124 R
7,098,738 B2 * 8/2006 Tam et al. ................ 330/284
2004/0207739 A1 * 10/2004 Rossi ...................... 348/300

* cited by examiner

*Primary Examiner*—Patricia Nguyen
(74) *Attorney, Agent, or Firm*—Sterne, Kessler, Goldstein & Fox, PLLC

(57) ABSTRACT

A transmitter includes a first variable gain amplifier (VGA) and a second VGA coupled to an output of the first VGA. The first and second VGAs each comprise a plurality of parallel gain stages. Gains of the first and second VGAs are equal to the sum of the gains of the activated parallel amplifiers within each corresponding plurality of parallel amplifiers. Each parallel amplifier comprises a parallel differential amplifier controlled by a pair of switches to activate and deactivate the parallel differential amplifier. The gains of the first and second VGAs are increased by activating additional parallel amplifiers. The gains of the first and second VGAs are decreased by deactivating additional parallel amplifiers. The variable gains of the first and second VGAs provide an extended gain control with improved local oscillator (LO) leakage interference rejection.

22 Claims, 10 Drawing Sheets

TRANSMITTER APPARATUS WITH EXTENDED GAIN CONTROL

BACKGROUND OF THE INVENTION

1. Field of the Invention

The present invention generally relates to the gain control of a wireless transmitter. More specifically, the present invention provides a wireless transmitter having an extended gain control with improved local oscillator (LO) leakage rejection.

2. Background Art

A wireless transmitter uses gain control to efficiently transmit signals. Properly setting an output power of a transmitted signal conserves battery power and prevents the transmitted signal from interfering with other wireless transmitters.

Often, the gain of a wireless transmitter is implemented in two stages. A first gain stage provides a programmable or variable gain. A second gain stage provides a fixed or constant gain. As a result, the range of the gain is limited by the variable gain of the first gain stage. Further, if the first and second gain stages are implemented after up-conversion of the output signal to a radio frequency, the fixed gain of the second gain stage renders the wireless transmitter susceptible to LO leakage interference.

BRIEF SUMMARY OF THE INVENTION

Accordingly, the present invention is directed to a wireless transmitter having an extended gain control with improved LO leakage interference rejection.

In one aspect, there is provided a transmitter having a first variable gain amplifier (VGA) and a second VGA coupled to an output of the first VGA. The first and second VGAs each comprise a plurality of parallel gain stages. Gains of the first and second VGAs are equal to the sum of the gains of the activated parallel amplifiers within each corresponding plurality of parallel amplifiers. Each parallel amplifier comprises a parallel differential amplifier controlled by a pair of switches to activate and deactivate the parallel differential amplifier. The gains of the first and second VGAs are increased by activating additional parallel amplifiers. The gains of the first and second VGAs are decreased by deactivating additional parallel amplifiers.

In another aspect there is provided a method of amplifying an input signal to produce an amplified output signal. The input signal is amplified using a first VGA to produce a first output signal. A gain of the first VGA is equal to a sum of gains of a first plurality of activated parallel amplifiers. The first output signal is amplified using a second VGA to produce the amplified output signal. A gain of the second VGA is equal to a sum of gains of a second plurality of activated parallel amplifiers.

In another aspect there is provided a method mitigating LO leakage interference within a wireless transmitter. An input signal is received by a first VGA. The input signal is amplified using a first VGA to produce a first output signal. A gain of the first VGA is equal to a sum of gains of a first plurality of activated parallel amplifiers. The first output signal is amplified using a second VGA to produce a second output signal. A gain of the second VGA is equal to a sum of gains of a second plurality of activated parallel amplifiers. The gain of the first VGA is adjusted to provide a desired signal-to-interference ratio (SIR) at an input of the second VGA. The gain of the second VGA is adjusted to set a desired power level of the second output signal. The gains of the first and second VGAs can be increased by activating additional parallel amplifiers. The gains of the first and second VGAs can be decreased by deactivating additional parallel amplifiers.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 7:
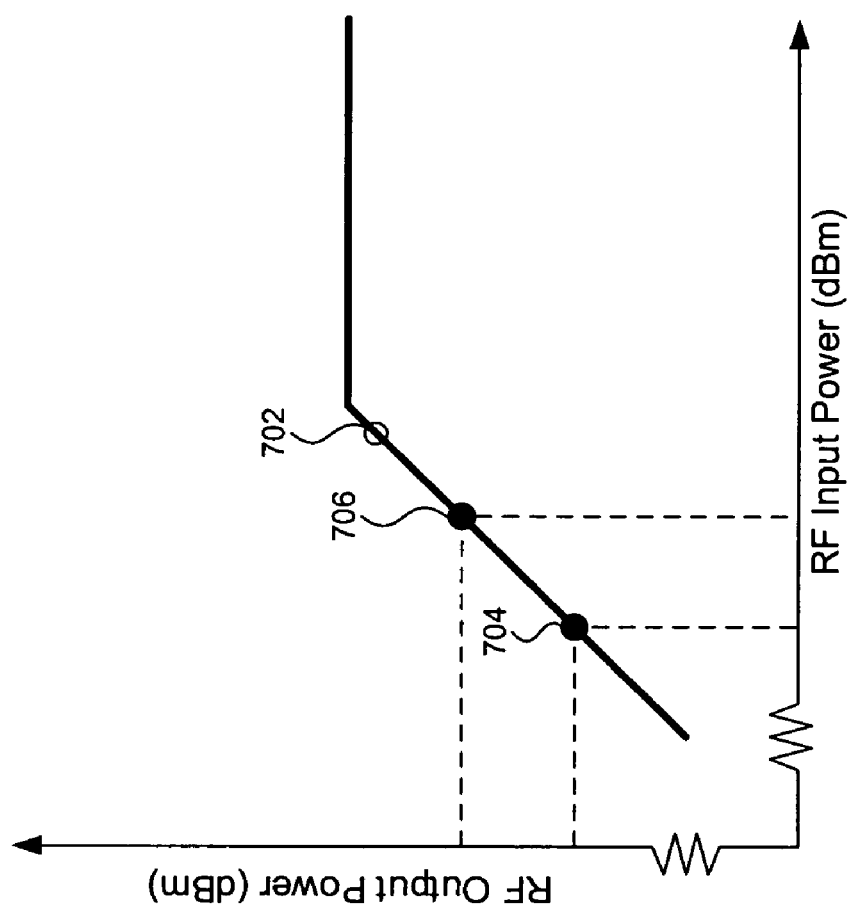
FIG. 7 illustrates an output characteristic of the second VGA as a gain of the first VGA is varied and a gain of the second VGA is held constant.
Figure 9:
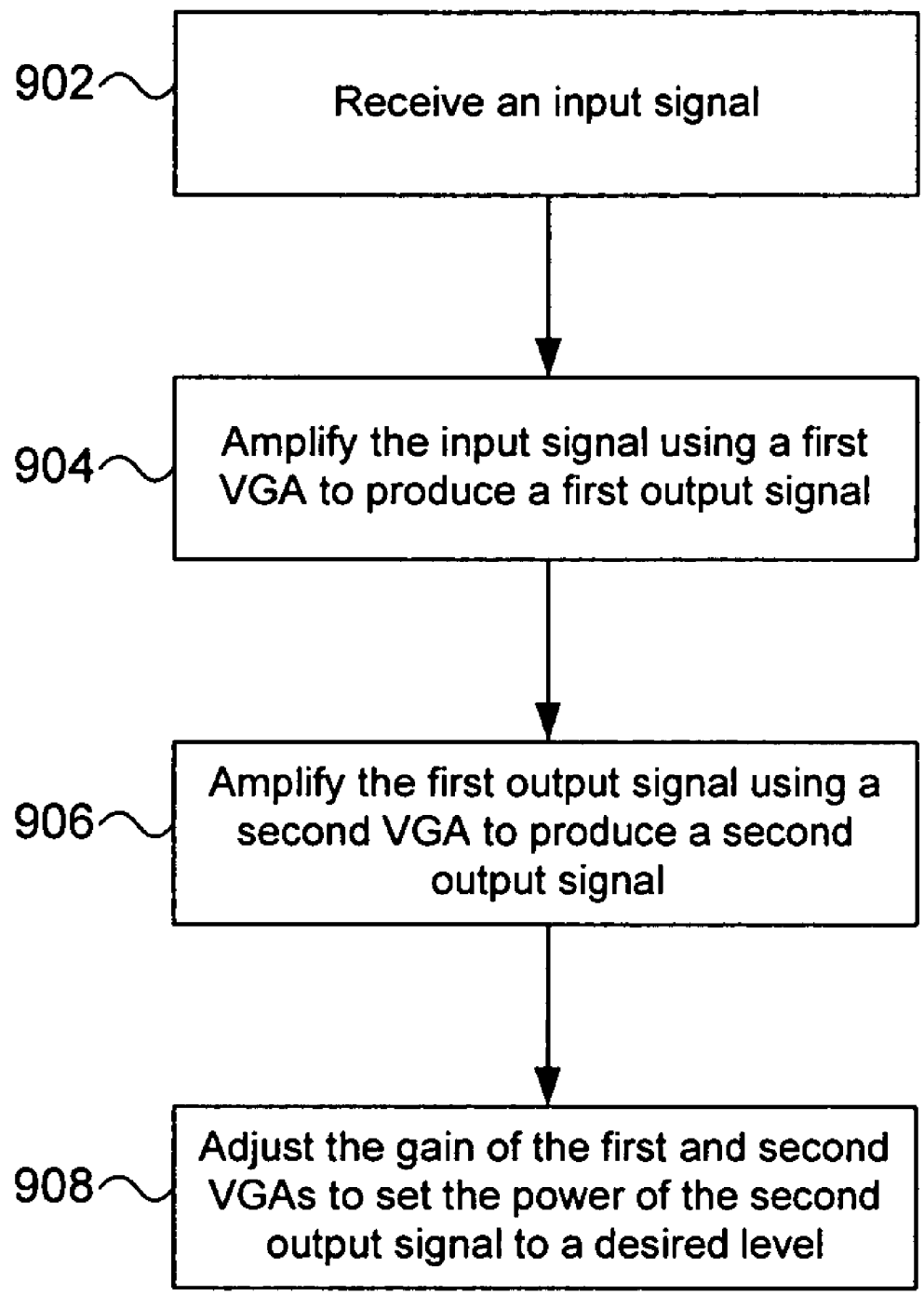

FIG. 9 provides a flowchart that illustrates operational steps corresponding to FIG. 7 for using a two-stage gain control mechanism of the present invention to amplify an input signal to produce an amplified output signal.

Figure 10:
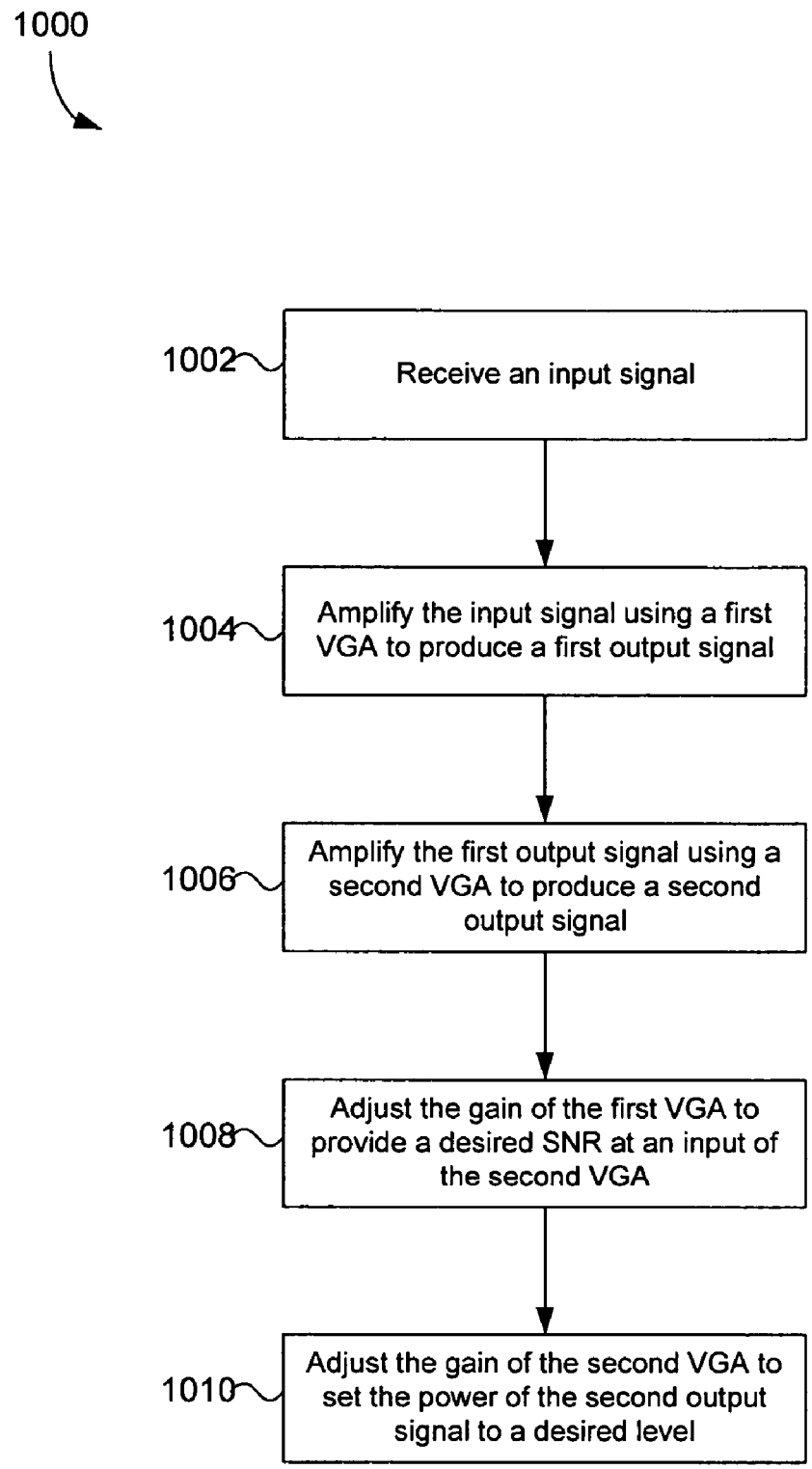

FIG. 10 provides a flowchart that illustrates operational steps corresponding to FIG. 7 for using the two-stage gain control mechanism of the present invention to mitigate LO leakage interference within a wireless transmitter.

DETAILED DESCRIPTION OF THE INVENTION

Figure 1:
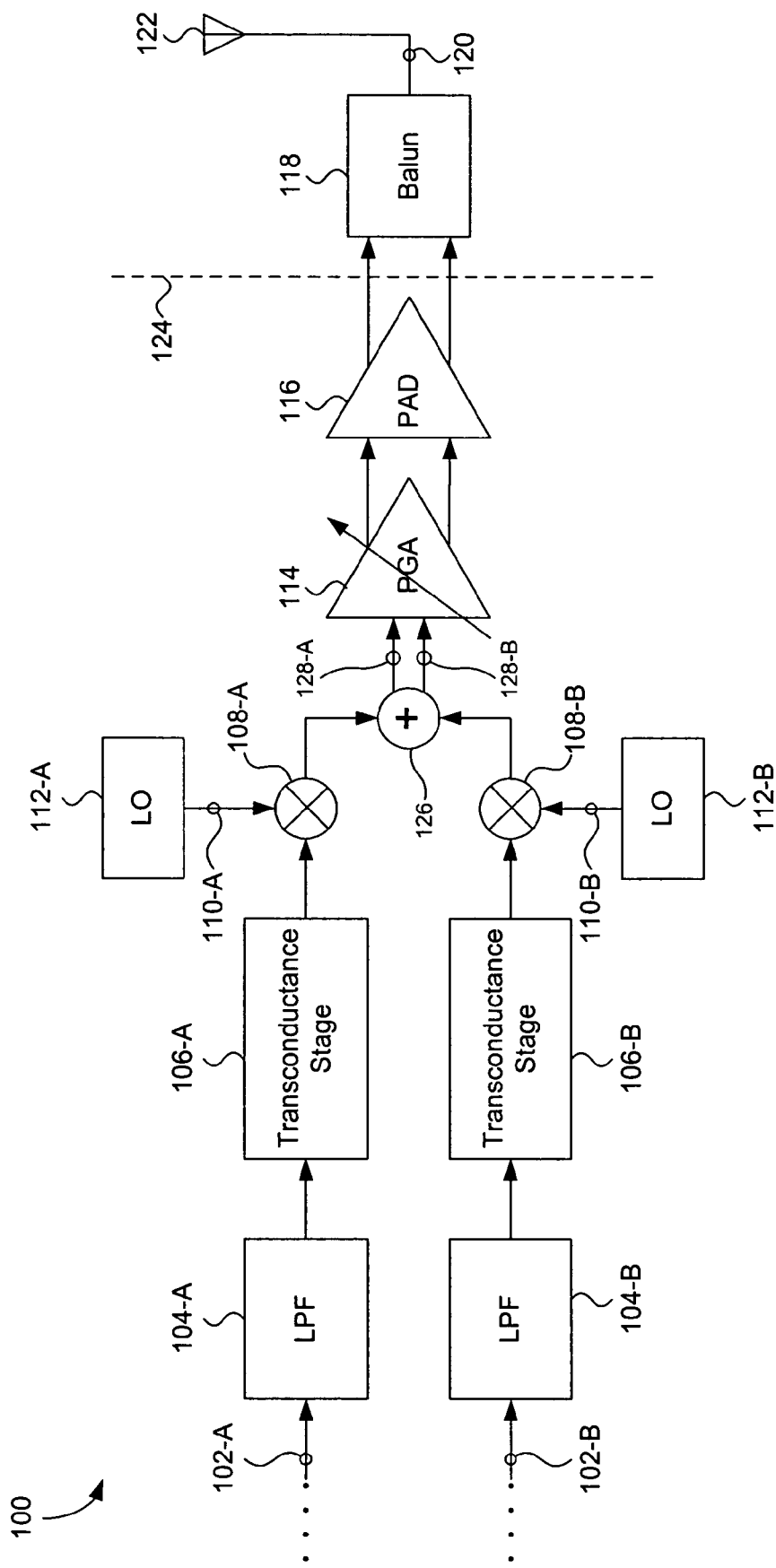
FIG. 1 illustrates a conventional wireless transmitter.

FIG. 1 illustrates a conventional wireless transmitter 100. The conventional wireless transmitter 100 receives modulated data signals 102-A and 102-B from a modulator (not shown in FIG. 1). Typically, the modulated data signals 102-A and 102-B are generated by a modulator that encodes and modulates a data signal provided by an information source. The modulator often generates the modulated data signals 102-A and 102-B as multiple-bit digital signals. Each modulated data signal 102-A and 102-B is then converted to a differential analog signal by a digital-to-analog converter (DAC; not shown in FIG. 1) for transmission. Further, the modulated data signals 102-A and 102-B can be modulated at baseband or an intermediate frequency (IF).

As shown in FIG. 1, the modulated data signals 102-A and 102-B, as differential analog signals, are provided to low-pass filters (LPFs) 104-A and 104-B and transconductance stages 106-A and 106-B, respectively. The LPF 104-A isolates an appropriate portion of the modulated data signal 102-A for transmission. The transconductance stage 106-A converts the modulated data signal 102-A from a differential voltage signal into a differential current signal. Similarly, the LPF 104-B isolates an appropriate portion of the modulated data signal 102-B for transmission and the transconductance stage 106-B converts the modulated data signal 102-B from a differential voltage signal into a differential current signal.

The conventional wireless transmitter 100 further includes a pair of mixers 108-A and 108-B. The mixer 108-A receives a carrier signal 110-A from a local oscillator (LO) 112-A. The mixer 108-A up-converts the modulated data signal 102-A to a frequency of the carrier signal 110-A. Similarly, the mixer 108-B receives a carrier signal 10-B from an LO 112-B. The mixer 108-B up-converts the modulated data signal 102-B to a frequency of the carrier signal 110-B. Typically, the modulated data signals 102-A and 102-B are up-converted to a radio frequency (RF) for transmission.

As further illustrated in FIG. 1, the mixers 108-A and 108-B are coupled to an adder 126. The adder 126 sums corresponding differential components of the differential analog signals produced by the mixers 108-A and 108-B. In this way, the adder 126 produces a differential up-converted modulated signal 128 (shown in FIG. 1 as up-converted modulated signals 128-A and 128-B).

The adder 126 is coupled to a conventional programmable gain amplifier (PGA) 114. The adder 126 provides the up-converted modulated signals 128-A and 128-B to the conventional PGA 114. The conventional PGA 114 amplifies the up-converted modulated signals 128-A and 128-B. The gain of the conventional PGA 114 is programmable, or variable, and so can be adjusted during operation of the conventional wireless transmitter 100. The conventional PGA 114 provides the up-converted modulated signals 128-A and 128-B to a conventional power amplifier driver (PAD) 116. The conventional PAD 116 also amplifies the up-converted modulated signals 128-A and 128-B. The gain of the conventional PAD 116 is fixed and so cannot be adjusted during operation of the conventional wireless transmitter 100.

The conventional PAD 116 provides the amplified up-converted modulated signals 128-A and 128-B to a balun 118. The balun 118 converts the differential up-converted modulated signals 128-A and 128-B into a single-ended output signal 120. The single-ended output signal 120 is provided to an antenna 122 for wireless transmission. As illustrated by a chip boundary 124, the balun 118 and the antenna 122 are not located on the same semiconductor chip containing the other elements of the conventional wireless transmitter 100. That is, the balun 118 and the antenna 122 are located "off-chip" while the other elements of the conventional wireless transmitter 100 reside entirely on a single semiconductor chip.

The conventional wireless transmitter 100 can be adapted to provide a variety of single-ended output signals 120 by varying the modulation schemes used to generate the modulated data signals 102-A and 102-B. Further, the conventional wireless transmitter 100 can be adapted to up-convert the modulated data signals 102-A and 102-B onto a variety of transmission channel bandwidths by altering the LPFs 104-A and 104-B and the carrier signals 110-A and 110-B. That is, by adjusting the operation of the conventional wireless transmitter 100, the conventional wireless transmitter 100 can provide a single-ended output signal 120 that conforms to a variety of communication protocols, standards, or known schemes. For example, the conventional wireless transmitter 100 can be operated according to the IEEE 802.11 g standard.

The conventional PGA 114 and the conventional PAD 116 together provide conventional two-stage gain control for the conventional wireless transmitter 100. Specifically, the variable gain of the conventional PGA 114 and the fixed gain of the conventional PAD 116 are used to adjust the power level of the single-ended output signal 120. As illustrated in FIG. 1, the gain control provided by the conventional PGA 114 and the conventional PAD 116 is implemented after the differential modulated data signals 102-A and 102-B are up-converted to an RF frequency. Implementing gain control after up-conversion reduces the possibility of degrading the image rejection and LO rejection performance of the conventional wireless transmitter 100. Implementing gain control before up-conversion (i.e., at baseband) offers highly precise control but at the expense of adversely affecting LO rejection quality. Further, implementing gain control at baseband often requires DACs with higher resolution, which may not be possible.

Adjusting the power level of the single-ended output signal 120 is particularly useful when the conventional wireless transmitter 100 operates within a multiple-user environment. For example, a mobile wireless transmitter uses gain control to lower the power level of a transmit signal when the mobile wireless transmitter is located near a base station or wireless hub. Lowering the power level of the transmit signal conserves battery life and lowers operating costs. Lowering the power level of the transmit signal also prevents the transmit signal from overpowering or "drowning-out" transmit signals from other mobile wireless transmitters communicating with the same base station. Gain control is also used by the wireless transmitter to increase the power level of the transmit signal to ensure reception when the mobile transmitter is located far from the base station.

The conventional gain control provided by the conventional PGA 114 and the conventional PAD 116, however, is limited. Because the gain of the conventional PAD 116 is fixed, the gain control range provided by the conventional PGA 114 and the conventional PAD 116 is essentially limited by the variable gain of the conventional PGA 114. That is, the fixed gain of the conventional PAD 116 restricts the gain control range of the conventional PGA 114 and the conventional PAD 116. Further, the fixed gain of the conventional PAD 116 makes the gain control provided by the conventional PGA 114 and conventional PAD 116 susceptible to interference when an LO leakage signal is coupled to the output of the conventional PGA 114 (the input of the conventional PAD 116).

Figure 2:
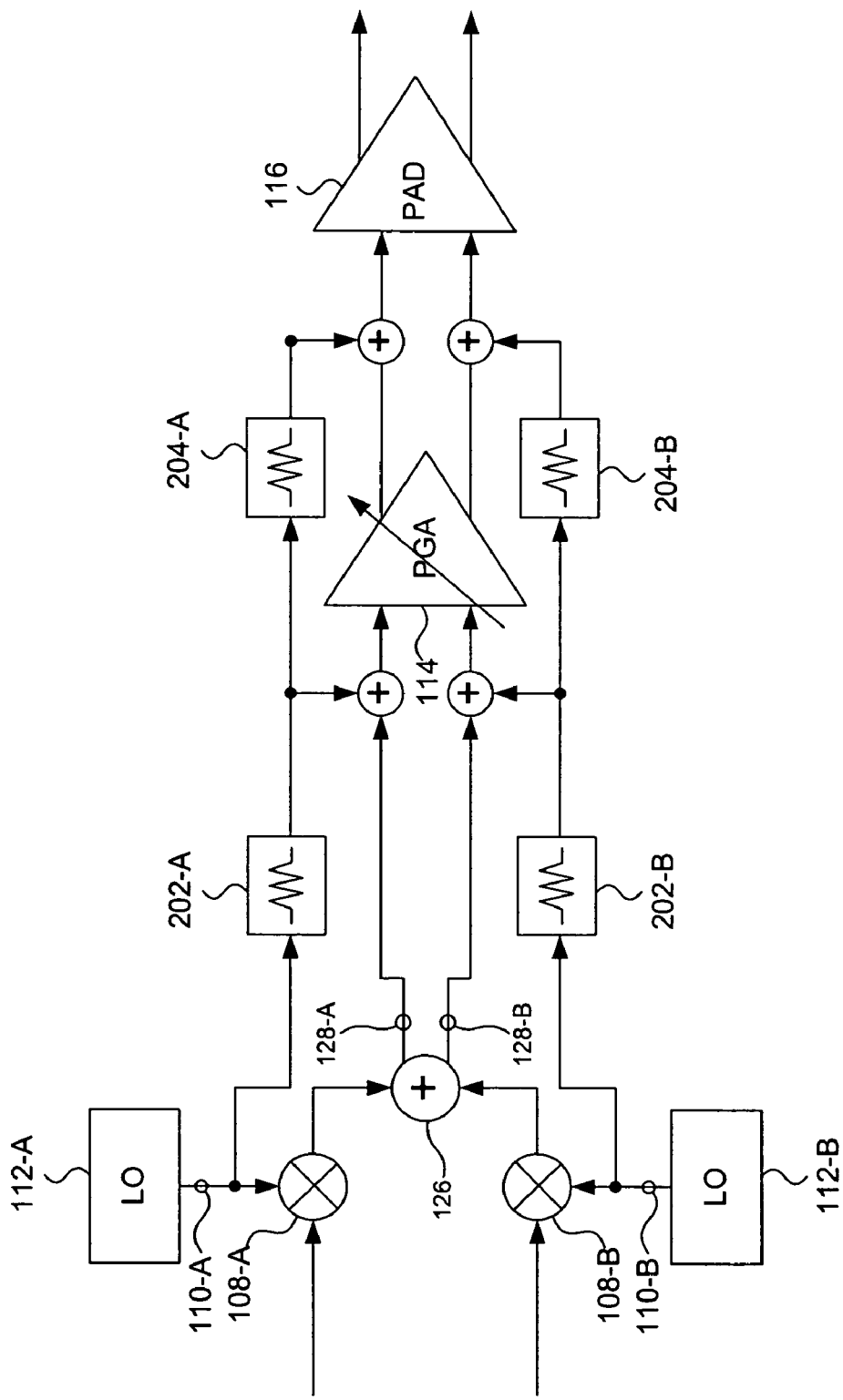
FIG. 2 illustrates local oscillator (LO) leakage interference within a portion of the conventional wireless transmitter depicted in FIG. 1.

FIG. 2 illustrates LO leakage within a portion of the conventional wireless transmitter 100. LO leakage is caused by direct coupling of the carrier signals 110-A and 110-B to the input of the conventional PGA 114 and the input of the conventional PAD 116. In effect, the carrier signals 110-A and 110-B appear as interference at the inputs of the conventional PGA 114 and the conventional PAD 116. A model of LO leakage within a portion of the conventional wireless transmitter 100 is provided by FIG. 2. The LO leakage signal strength appearing at an input of a circuit device decreases as distance increases and as the input resistance of the circuit device decreases.

As shown in FIG. 2, attenuated versions of the carrier signals 110-A and 110-B are coupled to the input of the conventional PGA 114. Specifically, the carrier signals 110-A and 110-B are attenuated by attenuators 202-A and 202-B, respectively, and are connected to the input of the conventional PGA 114. The LOs 112-A and 112-B are not connected by a transmission line to the input of the conventional PGA 114. Further, the distance between the LOs 112-A and 112-B and the input of the conventional PGA 114 is non-negligible. Therefore, the carrier signals 110-A and 110-B coupled to the input of the conventional PGA 114 are modeled as attenuated versions of the carrier signals 110-A and 110-B generated at the output of the LOs 112-A and 112-B, respectively.

Similarly, attenuated versions of the carrier signals 110-A and 110-B are coupled to the input of the conventional PAD 116. Specifically, the carrier signals 110-A and 110-B are attenuated by attenuators 204-A and 204-B, respectively, and are connected to the input of the conventional PAD 116. As previously mentioned, the LO leakage signal strength appearing at an input of a circuit device decreases as distance increases and as the input resistance of the circuit device decreases. Therefore, the carrier signals 110-A and 110-B coupled to the input of the conventional PAD 116 are typically attenuated by a greater amount than the carrier-signals 110-A and 110-B coupled to the input of the conventional PGA 114. Further, attenuated versions of the carrier signals 110-A and 110-B are not shown coupled to the input of the balun 118 (not shown in FIG. 2) due to the distance between the LOs 112-A and 112-B and the input of the balun 118, as well as to the low input resistance of the antenna 122.

During operation, the variable gain of the conventional PGA 114 is adjusted, with respect to the fixed gain of the conventional PAD 116, to set a desired power level of the single-ended output signal 120 (not shown in FIG. 2). When the desired power level of the single-ended output signal 120 is low, the conventional PGA 114 must reduce its gain since the gain of the conventional PAD 116 is fixed. Lowering the gain of the conventional PGA 114 too much renders the gain control provided by the conventional PGA 114 and the conventional PAD 116 susceptible to LO leakage interference. Specifically, if the LO leakage signal strength appearing at the input of the conventional PAD 116 is high, and the gain of the conventional PGA 114 is low, then the signal-to-interference ratio (SIR) at the input of the conventional PAD 116 may dip below an acceptable level. Since the SIR at the input of the conventional PAD 116 approximately equals the SIR at the output of the antenna 122 (not shown in FIG. 2), it is possible for the gain control of the conventional PGA 114 and the conventional PAD 116 to produce a single-ended output signal 120 that is overly-corrupted by interference. Therefore, it is desired to develop a gain control mechanism that is less susceptible to LO leakage effects. Further, it is desired to develop a gain control mechanism having an extended range to provide a broader range of amplification.

Figure 3:
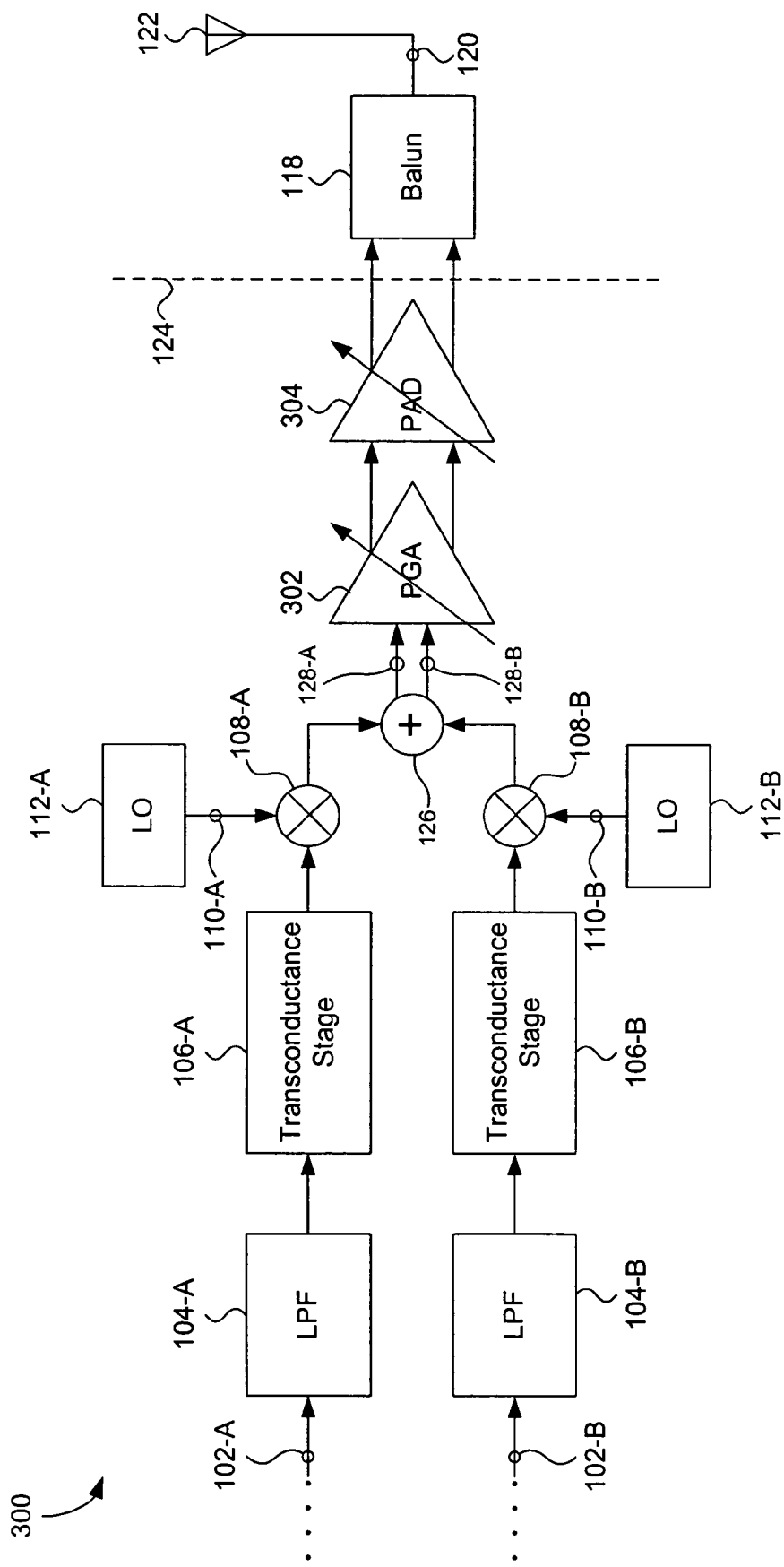
FIG. 3 illustrates a wireless transmitter having an extended gain control that is capable of mitigating LO leakage interference according to the present invention.

FIG. 3 illustrates a wireless transmitter 300 having an extended gain control that is capable of mitigating LO leakage interference according to the present invention. The gain control mechanism of the wireless transmitter 300 includes a programmable gain amplifier (PGA) 302 and a programmable power amplifier driver (PAD) 304. The gain of the PGA 302 is programmable, or variable, and so can be adjusted during operation of the wireless transmitter 300. Similarly, the gain of the PAD 304 is variable and can be adjusted during operation of the wireless transmitter 300.

The PGA 302 and the PAD 304 therefore operate as variable gain amplifiers (VGAs). As a result, the gain control range of the wireless transmitter 300 is extended. Further, the gain control provided by the PGA 302 and the PAD 304 can be adjusted to provide a desired output power level at the output of the PAD 304 while simultaneously providing a desired SIR at the input of the PAD 304, thereby mitigating LO leakage interference.

Figure 4:
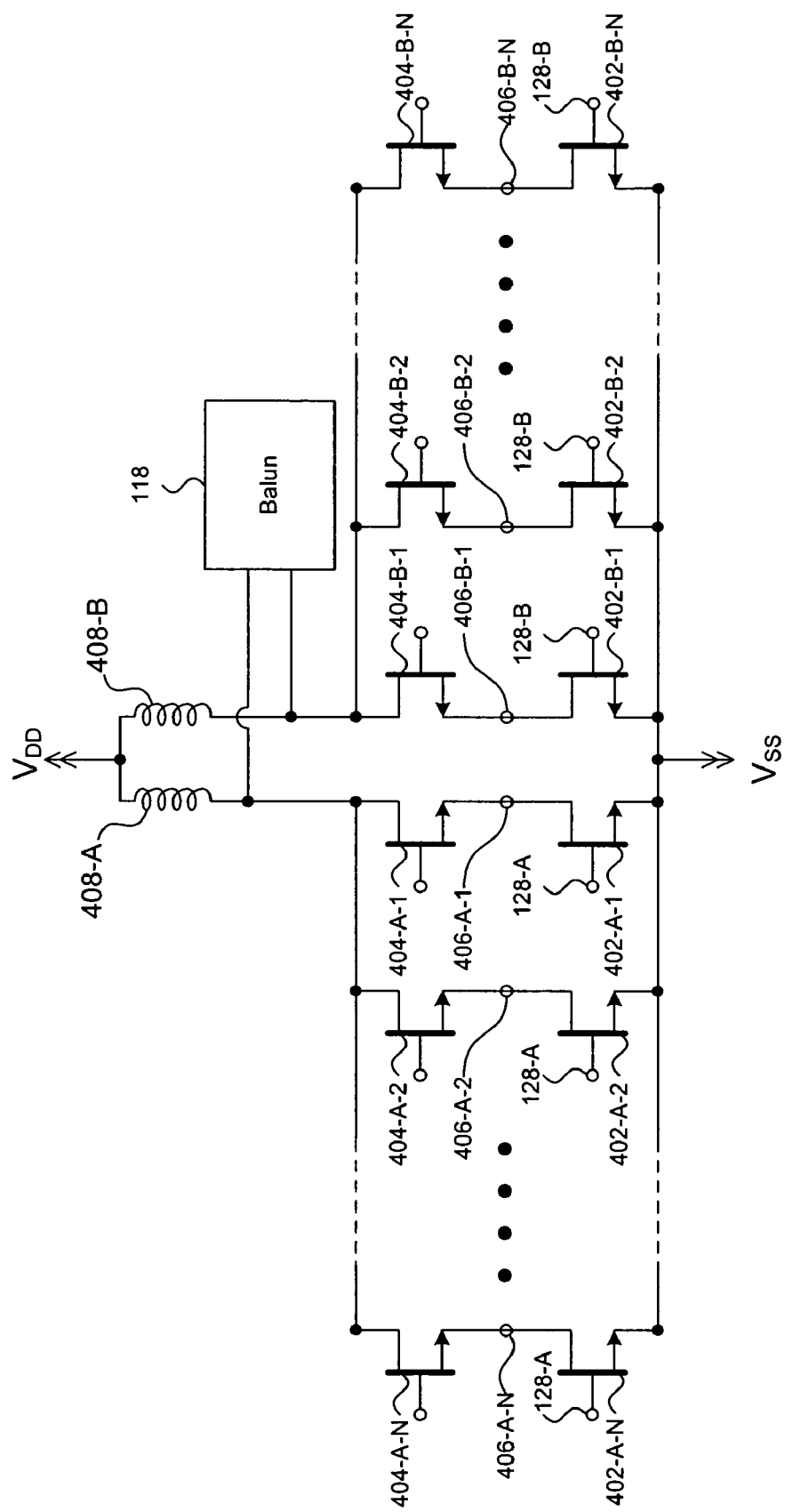
FIG. 4 illustrates an embodiment of a second variable gain amplifier (VGA) of the present invention depicted in FIG. 3.

FIG. 4 illustrates an embodiment of the PAD 304 according to the present invention. The PAD 304 includes a number of parallel differential amplifiers. The parallel differential amplifiers are implemented with Field-Effect Transistors (FETs). Each parallel differential amplifier includes four FETs. A first parallel differential amplifier includes a FET 402-A-1, a FET 402-B-1, a FET 404-A-1 and a FET 404-B-1. A second parallel differential amplifier includes a FET 402-A-2, a FET 402-B-2, a FET 404-A-2 and a FET 404-B-2. An Nth parallel differential amplifier includes a FET 402-A-N, a FET 402-B-N, a FET 404-A-N and a FET 404-B-N.

The sources of the FETs 402-A-1 through 402-A-N and the sources of the FETs 402-B-1 through 402-B-N are coupled to a voltage supply $V_{SS}$. $V_{SS}$ typically provides a relatively low or negative voltage or, alternatively, is a ground. The gates of the FETs 402-A-1 through 402-A-N are coupled to the up-converted modulated signal 128-A. The gates of the FETs 402-B-1 through 402-B-N are coupled to the up-converted modulated signal 128-B.

As further shown in FIG. 4, the drains of the FETs 402-A-1 through 402-A-N are connected to the sources of the FETs 404-A-1 through 404-A-N. Similarly, the drains of the FETs 402-B-1 through 402-B-N are connected to the sources of the FETs 404-B-1 through 404-B-N. The gates of the FETs 404-A-1 through 404-A-N and the gates of the FETs 404-B-1 through 404-B-N can be toggled between a positive voltage and ground so that the FETs 404-A-1 through 404-A-N and the FETs 404-B-1 through 404-B-N operate as switches. The drains of the FETs 404-A-1 through 404-A-N and the FETs 404-B-1 through 404-B-N are differentially coupled to the primary windings of the balun 118. Further, the drains of the FETs 404-A-1 through 404-A-N are coupled to voltage supply $V_{DD}$ through an inductor 408-A. Similarly, the drains of the FETs 404-B-1 through 404-B-N are coupled to $V_{DD}$ through an inductor 408-B. The inductors 408-A and 408-B provide a load to the parallel differential amplifiers of the PAD 304 while $V_{DD}$ provides a power supply to the differential amplifiers through the inductors 408-A and 408-B.

The FETs 402-A-1 through 402-A-N amplify the up-converted modulated signal 128-A and produce amplified modulated data signals 406-A-1 through 406-A-N, respectively. The amplified modulated data signals 406-A-1 through 406-A-N are provided to the balun 118 when corresponding switches 404-A-1 through 404-A-N are turned on. Similarly, the FETs 402-B-1 through 402-B-N amplify the up-converted modulated signal 128-B and produce amplified modulated data signals 406-B-1 through 406-B-N, respectively. The amplified modulated data signals 406-B-1 through 406-B-N are provided to the balun 118 when corresponding switches 404-B-1 through 404-B-N are turned on.

The gain of the PAD 304 is determined by the sum of gains of the individual differential amplifiers of the PAD 304. Specifically, the gain of the PAD 304 is determined by the number of differential amplifiers that provide output signals to the balun 118. The individual differential amplifiers of the PAD 304 can be biased to provide either equal or unequal, fixed gains.

To provide an output signal to the balun 118, a differential amplifier must be switched on. The first differential amplifier provides differential amplified modulated data signals 406-A-1 and 406-B-1 when FETs 404-A-1 and 404-B-1 are turned on. The second differential amplifier provides differential amplified modulated data signals 406-A-2 and 406-B-2 when FETs 404-A-2 and 404-B-2 are turned on. The Nth differential amplifier provides differential amplified modulated data signals 406-A-N and 406-B-N when FETs 404-A-N and 404-B-N are turned on. In this way, the gain of the PAD 304 can be increased by turning on additional differential amplifiers or can be decreased by turning off additional differential amplifiers. The PAD 304 can be biased and arranged so that the gain of the PAD 304 monotonically increases or monotonically decreases when differential amplifiers are successively switched on or off, respectively. Further, the PAD 304 can be operated to provide minimum gain increases and decreases (e.g., gain changes in steps of 3 dB)

Figure 5:
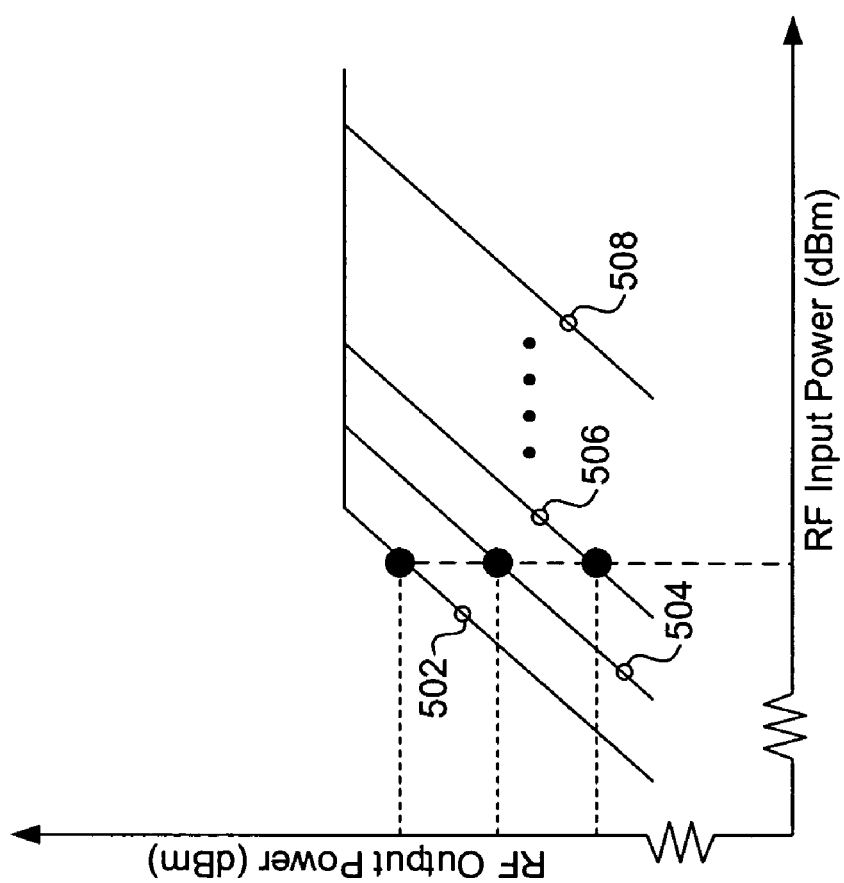
FIG. 5 illustrates output characteristics of the second VGA depicted in FIG. 4.

FIG. 5 illustrates the output characteristics of the PAD 304. FIG. 5 depicts the relationship between the RF input power of the PAD 304 and the RF output power of the PAD 304. The RF output power and the RF input power of the PAD 304 exhibit a linear relationship until the RF output power becomes saturated. That is, the gain of the PAD 304 is constant across a range of RF input power values until a maximum RF output power level is reached. This maximum RF output power or saturation point is primarily determined by the voltage supply $V_{DD}$ used to bias the PAD 304.

Multiple output characteristic curves are shown in FIG. 5. A curve 502 is the output characteristic of the PAD 304 under a maximum gain condition. Specifically, the curve 502 represents the relationship between the RF input power and RF output power when all parallel differential amplifiers of the PAD 304 are turned on. A curve 504 shows the output characteristic of the PAD 304 when only one parallel differential amplifier is turned off. A curve 506 shows the output characteristics of the PAD 304 when two parallel differential amplifiers are turned off. A curve 508 shows the output characteristic of the PAD 304 when only one parallel differential amplifier is turned on. The curve 508, therefore, presents the output characteristic of the PAD 309 under a minimum gain condition. Comparing the curves 502, 504 and 506 reveals that more RF output power is provided by the PAD 304 for a given RF input power as more parallel differential amplifiers are turned on.

Figure 6:
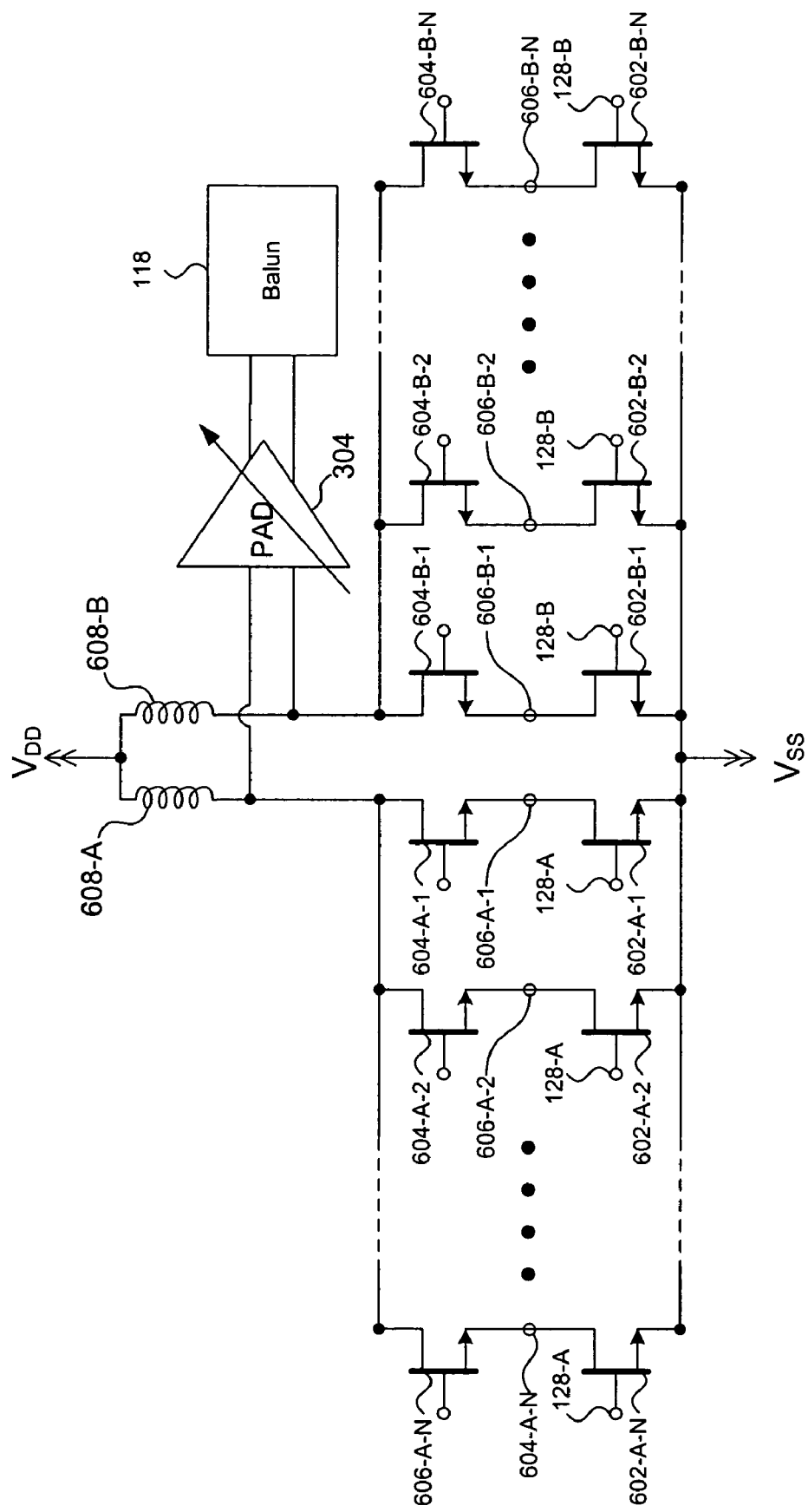
FIG. 6 illustrates an embodiment of a first VGA of the present invention depicted in FIG. 3.

FIG. 6 illustrates an embodiment of the PGA 302 according to the present invention. In spirit, the implementation of the PGA 302 follows the implementation of the PAD 304. The PGA 302 includes a number of parallel differential amplifiers. The parallel differential amplifiers are implemented with FETs. Each parallel differential amplifier includes four FETs. A first parallel differential amplifier includes a FET 602-A-1, a FET 602-B-1, a FET 604-A-1 and a FET 604-B-1. A second parallel differential amplifier includes a FET 602-A-2, a FET 602-B-2, a FET 604-A-2 and a FET 604-B-2. An Nth parallel differential amplifier includes a FET 602-A-N, a FET 602-B-N, a FET 604-A-N and a FET 604-B-N.

The sources of the FETs 602-A-1 through 602-A-N and the sources of the FETs 602-B-1 through 602-B-N are coupled to the voltage supply $V_{SS}$. The gates of the FETs 602-A-1 through 602-A-N are coupled to the up-converted modulated signal 128-A. The gates of the FETs 602-B-1 through 602-B-N are coupled to the up-converted modulated signal 128-B.

As further shown in FIG. 6, the drains of the FETs 602-A-1 through 602-A-N are connected to the sources of the FETs 604-A-1 through 604-A-N. Similarly, the drains of the FETs 602-B-1 through 602-B-N are connected to the sources of the FETs 604-B-1 through 604-B-N. The gates of the FETs 604-A-1 through 604-A-N and the gates of the FETs 604-B-1 through 604-B-N can be toggled between a positive voltage and ground so that the FETs 604-A-1 through 604-A-N and the FETs 604-B-1 through 604-B-N operate as switches. The drains of the FETs 604-A-1 through 604-A-N and the FETs 604-B-1 through 604-B-N are differentially coupled to the PAD 304. The PAD 304 is differentially coupled to the balun 118. Further, the drains of the FETs 604-A-1 through 604-A-N are coupled to the voltage supply $V_{DD}$ through an inductor 608-A. Similarly, the drains of the FETs 604-B-1 through 604-B-N are coupled to $V_{DD}$ through an inductor 608-B. The inductors 608-A and 608-B provide a load to the parallel differential amplifiers of the PGA 302 while $V_{DD}$ provides a power supply to the differential amplifiers through the inductors 608-A and 608-B.

The FETs 602-A-1 through 602-A-N amplify the up-converted modulated signal 128-A and produce amplified modulated data signals 606-A-1 through 606-A-N, respectively. The amplified modulated data signals 606-A-1 through 606-A-N are provided to the PAD 304 when corresponding switches 604-A-1 through 604-A-N are turned on. Similarly, the FETs 602-B-1 through 602-B-N amplify the up-converted modulated signal 102-B and produce amplified modulated data signals 606-B-1 through 606-B-N, respectively. The amplified modulated data signals 606-B-1 through 606-B-N are provided to the PAD 304 when corresponding switches 604-B-1 through 604-B-N are turned on.

The gain of the PGA 302 is determined by the sum of gains of the individual differential amplifiers of the PGA 302. Specifically, the gain of the PGA 302 is determined by the number of differential amplifiers that provide output signals to the PAD 304. The individual differential amplifiers of the PGA 302 can be biased to provide either equal or unequal, fixed gains.

To provide an output signal to the PAD 304, a differential amplifier must be switched on. The first differential amplifier provides differential amplified modulated data signals 606-A-1 and 606-B-1 when FETs 604-A-1 and 604-B-1 are turned on. The second differential amplifier provides differential amplified modulated data signals 606-A-2 and 606-B-2 when FETs 604-A-2 and 604-B-2 are turned on. The Nth differential amplifier provides differential amplified modulated data signals 606-A-N and 606-B-N when FETs 604-A-N and 604-B-N are turned on. In this way, the gain of the PGA 302 can be increased by turning on additional differential amplifiers or can be decreased by turning off additional differential amplifiers. The PGA 302 can be biased and arranged so that the gain of the PGA 302 monotonically increases or monotonically decreases when differential amplifiers are successively switched on or off, respectively. Further, the PGA 302 can be operated to provide minimum gain increases and decreases (e.g., gain changes in steps of 3 dB)

FIG. 7 illustrates the relationship between the RF input power and the RF output power of the PAD 304 as the gain of the PGA 302 is varied and the gain of the PAD 304 is held constant. A curve 702 represents the output characteristic of the PAD 304 when the gain of the PAD 304 is fixed. That is, the curve 702 represents the output characteristic of the PAD 304 when n of the N parallel differential amplifiers of the PAD 304 are turned on. A gain point 704 represents the RF input power supplied to the PAD 304 by the PGA 302 when m of the M parallel differential amplifiers of the PGA 302 are turned on. As additional parallel differential amplifiers of the PGA 302 are turned on, more RF input power is supplied to the PAD 304 by the PGA 302. More RF input power is provided to the PAD 304 at a gain point 706 than at the gain point 704. Therefore, the gain of the PGA 302 is higher at the gain point 706 than at the gain point 704. Specifically, more than m of the M parallel switches of the PGA 302 are turned on at the gain point 706. Overall, adjusting the gain of the PGA 302 determines the operating point of the PAD 304 for a given fixed gain of the PAD 304.

Figure 8:
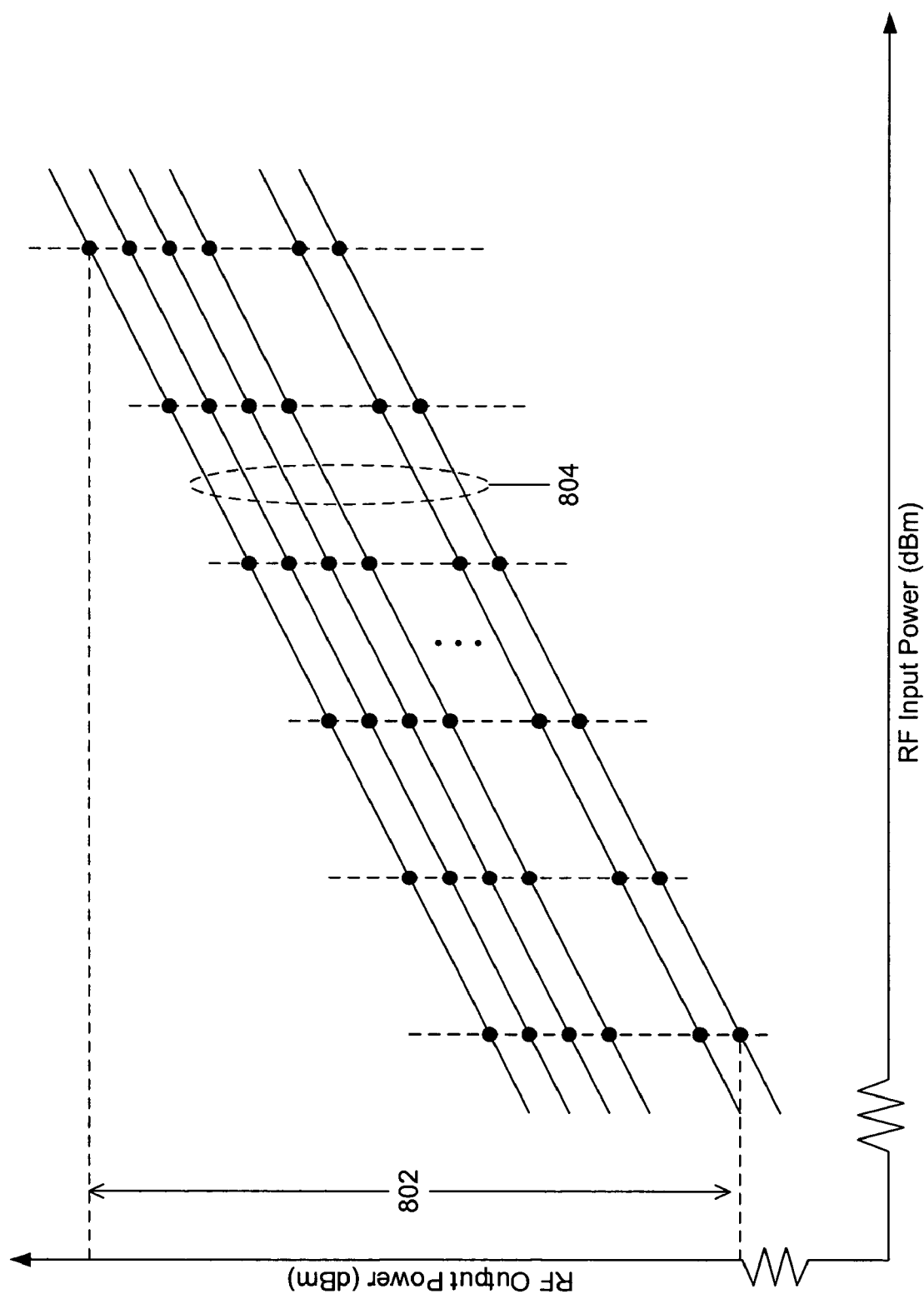
FIG. 8 illustrates output characteristics of the second VGA as the gains of the second VGA and the first VGA are varied.

FIG. 8 illustrates the relationship between the RF input power and the RF output power of the PAD 304 as the gains of both the PGA 302 and PAD 304 are varied. Output characteristic curves 804 correspond to changes in the gain of the PAD 304. The operating points on each characteristic curve correspond to changes in the gain of the PGA 302. A full range of the gain control 802 provided by the present invention is depicted as the difference in RF output power between the lowest operating point and the highest operating point of the PAD 304. The lowest operating point of the PAD 304 corresponds to the lowest gain setting of both the PGA 302 and the PAD 304. The highest operating point of the PAD 304 corresponds to the highest gain setting of both the PGA 302 and the PAD 304. In an embodiment of the present invention, the full range of gain control 802 provided is 48 dB.

FIG. 9 provides a flowchart 900 that illustrates operational steps corresponding to FIG. 7 for using the two-stage gain control mechanism of the present invention to amplify an input signal to produce an amplified output signal. The invention is not limited to this operational description. Rather, it will be apparent to persons skilled in the relevant art(s) from the teachings herein that other operational control flows are within the scope and spirit of the present invention. In the following discussion, the steps in FIG. 9 are described.

At step 902, an input signal is received by the first VGA. The input signal can be a baseband, IF or RF signal. The input signal can also be a modulated input signal.

At step 904, the input signal is amplified by the first VGA to produce a first output signal. A gain of the first VGA is equal to a sum of gains of a first plurality of activated parallel amplifiers comprising the first VGA.

At step 906, the first output signal is amplified by the second VGA to produce a second output signal. A gain of the second VGA is equal to a sum of gains of a second plurality of activated parallel amplifiers comprising the second VGA.

At step 908, the gains of the first and second VGAs are adjusted to set a power of the second output signal to a desired level. The gains of the first and second VGAs are increased by activating additional parallel amplifiers within the corresponding plurality of parallel amplifiers. The gains of the first and second VGAs are decreased by deactivating additional parallel amplifiers within the corresponding plurality of parallel amplifiers.

FIG. 10 provides a flowchart 1000 that illustrates operational steps corresponding to FIG. 7 for using a two-stage gain control mechanism to mitigate LO leakage interference within a wireless transmitter, according to the present invention. The invention is not limited to this operational description. Rather, it will be apparent to persons skilled in the relevant art(s) from the teachings herein that other operational control flows are within the scope and spirit of the present invention. In the following discussion, the steps in FIG. 10 are described.

At step 1002, an input signal is received by the first VGA. The input signal can be a baseband, IF or RF signal. The input signal can also be a modulated input signal. Further, the input signal can include interference caused by LO leakage.

At step 1004, the input signal is amplified by the first VGA to produce a first output signal. A gain of the first VGA is equal to a sum of gains of a first plurality of activated parallel amplifiers comprising the first VGA.

At step 1006, the first output signal is amplified by the second VGA to produce a second output signal. A gain of the second VGA is equal to a sum of gains of a second plurality of activated parallel amplifiers comprising the second VGA. The first output signal can include additional interference caused by LO leakage.

At step 1008, the gain of the first VGA is adjusted to provide a desired SIR level at the input of the second VGA. Specifically, the gain of the first VGA can be set to account for the interference from LO leakage that corrupts the first input signal and the first output signal. The gain of the first VGA is increased by activating additional parallel amplifiers within the plurality of parallel amplifiers comprising the first VGA. The gain of the first VGA is decreased by deactivating additional parallel amplifiers within the plurality of parallel amplifiers comprising the first VGA.

At 1010, the gain of the second VGA is adjusted to provide a desired power level of the second output signal. Specifically, the gain of the second VGA can be set to account for a power level of the first output signal provided by the first VGA. The gain of the second VGA is increased by activating additional parallel amplifiers within the plurality of parallel amplifiers comprising the second VGA. The gain of the second VGA is decreased by deactivating additional parallel amplifiers within the plurality of parallel amplifiers comprising the second VGA.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A transmitter, comprising:
a first variable gain amplifier; and
a second variable gain amplifier coupled to an output of the first variable gain amplifier;
wherein the first and second variable gain amplifiers each comprise a plurality of parallel amplifiers;
wherein a gain of the first and second variable gain amplifiers is determined by a number of activated parallel amplifiers within each corresponding plurality of parallel amplifiers; and
wherein a gain of the first variable gain amplifier is determined according to a target signal-to-interference ratio (SIR) at an input of the second variable gain amplifier.

2. The transmitter of claim 1, wherein:
each parallel amplifier comprises a parallel differential amplifier.

3. The transmitter of claim 2, wherein each parallel differential amplifier comprises:
a pair of transistors coupled to a differential input signal;
a pair of switches coupled to outputs of the pair of transistors.

4. The transmitter of claim 3, wherein:
the pair of transistors are biased to amplify the differential input signal; and
the pair of switches are activated to pass the amplified differential signal and are deactivated to block the amplified differential signal.

5. The transmitter of claim 4, wherein the number of activated parallel amplifiers within each corresponding plurality of parallel amplifiers is determined by a number of parallel differential amplifiers having the pair of switches activated.

6. The transmitter of claim 5, wherein:
the gains of the first and second variable gain amplifiers monotonically increase as additional parallel amplifiers within each corresponding plurality of parallel amplifiers are activated; and
the gains of the first and second variable gain amplifiers monotonically decrease as additional parallel amplifiers within each corresponding plurality of parallel amplifiers are deactivated.

7. The transmitter of claim 3, wherein the pair of transistors are Field-Effect Transistors (FETs).

8. The transmitter of claim 7, wherein the pair of switches comprise a pair of FETs.

9. The transmitter of claim 1, wherein the gains of the first and second variable gain amplifiers are substantially equal to a sum of gains of each activated parallel amplifier within each corresponding plurality of parallel amplifiers.

10. The transmitter of claim 9, wherein the gain of each parallel amplifier is fixed.

11. The transmitter of claim 10, wherein the gains of the parallel amplifiers are equal.

12. The transmitter of claim 10, wherein the gains of the parallel amplifiers are unequal.

13. The transmitter of claim 1, wherein the first and second variable gain amplifiers are radio frequency (RF) amplifiers.

14. The transmitter of claim 13, wherein:
an input of the first variable gain amplifier is coupled to an output of an RF mixer; and
an output of the second variable gain amplifier is coupled to an antenna.

15. The transmitter of claim 1, wherein the first and second variable amplifiers are linear amplifiers.

16. The transmitter of claim 1, wherein the second variable gain amplifier is a power amplifier.

17. A method, comprising:
(1) receiving a first input signal comprising an RF signal and a first interference signal;
(2) amplifying the first input signal using a first variable gain amplifier to produce a first output signal, a gain of the first variable gain a sum of gains of a first plurality of activated parallel amplifiers;
(3) amplifying a second input signal comprising the first output signal and a second interference signal using a second variable gain amplifier to produce a second output signal, a gain of the second variable gain amplifier being a sum of gains of a second plurality of activated parallel amplifiers; and
(4) changing the gains of the first and second variable gain amplifiers to reduce distortion of the second output signal by the first and second interference signals, including changing the gain of the first variable gain amplifier according to a target signal-to-interference ratio (SIR) at an input of the second variable gain amplifier.

18. The method of claim 17, wherein step (4) further comprises:
(b) changing the gain of the second variable gain amplifier according to a target output power of the second output signal.

19. The method of claim 18, wherein step (4)(*a*) and (4)(*b*) comprise:
(i) activating parallel amplifiers within the first and second plurality of parallel amplifiers to increase the gains of the first and second variable gain amplifiers, respectively.

20. The method of claim 18, wherein step (4)(*a*) and (4)(*b*) comprise:
(i) deactivating parallel amplifiers within the first and second plurality of parallel amplifiers to decrease the gains of the first and second variable gain amplifiers, respectively.

21. The method of claim 17, wherein:
the first interference signal is a first local oscillator (LO) leakage signal; and
the second interference signal is a second LO leakage signal.

22. A method, comprising:
(1) amplifying an input signal using a first variable gain amplifier to produce a first output signal, a gain of the first variable gain amplifier being a sum of gains of a first plurality of activated parallel amplifiers;
(2) amplifying the first output signal using a second variable gain amplifier to produce a second output signal, a gain of the second variable gain amplifier being a sum of gains of a second plurality of activated parallel amplifiers; and
(3) changing the gain of the first variable gain amplifier according to a target signal-to-interference ratio (SIR) at an input of the second variable gain amplifier;
wherein the first input signal is an RF signal.

* * * * *

UNITED STATES PATENT AND TRADEMARK OFFICE
CERTIFICATE OF CORRECTION

| | | |
|---|---|---|
| PATENT NO. | : 7,274,253 B2 | Page 1 of 1 |
| APPLICATION NO. | : 11/090067 | |
| DATED | : September 25, 2007 | |
| INVENTOR(S) | : Meng-An Pan | |

It is certified that error appears in the above-identified patent and that said Letters Patent is hereby corrected as shown below:

Column 12, Line 1, "the first variable gain a sum of gains" should appear as --the first variable gain amplifier being a sum of gains--.

Signed and Sealed this

Twenty-ninth Day of April, 2008

JON W. DUDAS
*Director of the United States Patent and Trademark Office*